US010381425B2

(12) United States Patent
Kang et al.

(10) Patent No.: US 10,381,425 B2
(45) Date of Patent: Aug. 13, 2019

(54) ORGANIC LIGHT EMITTING DISPLAY DEVICE

(71) Applicant: LG Display Co., Ltd., Seoul (KR)

(72) Inventors: Ji Yeon Kang, Seoul (KR); Il Chan Jung, Wonju-si (KR)

(73) Assignee: LG Display Co., Ltd., Seoul (KR)

( * ) Notice: Subject to any disclaimer, the term of this patent is extended or adjusted under 35 U.S.C. 154(b) by 184 days.

(21) Appl. No.: 15/591,992

(22) Filed: May 10, 2017

(65) Prior Publication Data

US 2018/0166520 A1    Jun. 14, 2018

(30) Foreign Application Priority Data

Dec. 8, 2016  (KR) .......................... 10-2016-0166953
Dec. 8, 2016  (KR) .......................... 10-2016-0166962

(51) Int. Cl.
*H01L 27/32* (2006.01)
*H01L 51/00* (2006.01)
*H01L 51/50* (2006.01)

(52) U.S. Cl.
CPC ...... *H01L 27/3248* (2013.01); *H01L 27/3211* (2013.01); *H01L 27/3246* (2013.01); *H01L 51/0097* (2013.01); *H01L 51/5056* (2013.01); *H01L 51/5088* (2013.01); *Y02E 10/549* (2013.01)

(58) Field of Classification Search
CPC ........................ H01L 51/0097; H01L 29/3272
See application file for complete search history.

(56) References Cited

U.S. PATENT DOCUMENTS

| 2014/0166995 | A1* | 6/2014 | Lee ..................... H01L 51/0097 257/40 |
| 2015/0034911 | A1* | 2/2015 | Liu ....................... H01L 31/053 257/40 |
| 2015/0077952 | A1  | 3/2015 | Kim |
| 2015/0195915 | A1* | 7/2015 | Namkung ............... B32B 37/26 361/750 |
| 2016/0181338 | A1* | 6/2016 | Heo .................... H01L 51/0097 257/40 |

OTHER PUBLICATIONS

European Search Report for European Patent Application No. EP 17177129, dated Jan. 11, 2018, 9 Pages.

* cited by examiner

*Primary Examiner* — Amar Movva
(74) *Attorney, Agent, or Firm* — Fenwick & West LLP (57) ABSTRACT

Provided is an organic light emitting display device having a protective substrate configured to minimize permeation of moisture or static electricity into the device. The protective substrate is disposed on the bottom surface of a substrate so as to support and protect a substrate having an organic light emitting diode from moisture.

19 Claims, 6 Drawing Sheets

ORGANIC LIGHT EMITTING DISPLAY DEVICE

CROSS-REFERENCE TO RELATED APPLICATIONS

This application claims the priority of Korean Patent Application No. 10-2016-0166953 filed on Dec. 8, 2016 and Korean Patent Application No. 10-2016-0166962 filed on Dec. 8, 2016 in the Korean Intellectual Property Office, each of which is incorporated by reference herein in its entirety.

BACKGROUND

Technical Field

The present disclosure relates to an organic light emitting display device and more particularly, to an organic light emitting display device including a structure configured to minimize permeation of static electricity and moisture.

Description of the Related Art

Recent display devices which can display various information and interact with a user who views the corresponding information have various sizes, various shapes, and various functions.

The display devices include a liquid crystal display device (LCD), an electrophoretic display device (EPD), quantum dot related display device, nano-particles related display device, and an organic light emitting diode display device (OLED).

The liquid crystal display device (LCD) is driven by using optical anisotropy and a polarization property of liquid crystals. Since the structure of the liquid crystals is thin and long, the arrangement of molecules has directivity and an electric field is artificially applied to the liquid crystals to control the direction of the molecule arrangement. Therefore, when the molecule arrangement direction of the liquid crystals is arbitrarily controlled, the molecule arrangement of the liquid crystals is changed and light is refracted in the molecule arrangement direction of the liquid crystals by the optical anisotropy, and as a result, the light is transmitted.

Pixels are driven by the light transmitted by changing the molecule arrangement direction of the liquid crystals corresponding to a plurality of pixels by such a property to display image information in the display device. As described above, the liquid crystal display device (LCD) requires a separate light source such as backlight in addition to a liquid crystal layer.

However, since the organic light emitting diode display device (OLED) as a self-light emitting display device does not require the separate light source, the organic light emitting diode display device (OLED) can be manufactured to be light and thin. Further, the organic light emitting display device (OLED) is driven with low voltage to be advantageous in terms of power consumption and excellent even in color expression, response speed, viewing angle, and contrast ratio (CR), and thus the organic light emitting display device has been considered as a next-generation display.

The organic light emitting display device (OLED) uses an organic material as an organic emission layer, and electrons and holes are injected into the organic emission layer configured by the organic material through two electrodes, and as a result, excitons are formed while the electrons and the holes meet on the organic emission layer and are recoupled to each other and the organic emission layer emits the light due to energy from the excitons.

The electrons and the holes are injected through an anode electrode which acts as a pixel electrode and a cathode electrode which acts as a common electrode and a driving element for controlling current injected into the pixel electrode is disposed. Further, in order to more smoothly inject the electrons and the holes, the organic emission layer may include a hole injection layer, a hole transport layer, an electron transport layer, and an electron injection layer and may be a multi-layer structure. Such layers may be distinct from each other or at least two of their functions could be integrated into a single layer.

The organic light emitting display device (OLED) displays information on a screen by emitting a plurality of pixels including an organic light emitting element having the organic emission layer and may be divided into an active matrix type organic light emitting diode display (AMOLED) or a passive matrix type organic light emitting diode display (PMOLED) according to a scheme to drive the pixel.

The active matrix type organic light emitting diode display (AMOLED) displays an image by controlling current which flows on an organic light emitting diode by using at least one thin film transistor (alternatively, "TFT").

The active matrix type organic light emitting diode display (AMOLED) may include various thin film transistors and includes a switching thin film transistor, a driving TFT connected with the switching TFT, and an organic light emitting diode (OLED) connected to the driving TFT.

The switching TFT may be formed at a portion where a scan line and a data line cross each other. The switching TFT serves to select the pixel. The switching TFT includes a gate electrode (gate line), a semiconductor layer, a source electrode (source line), and a drain electrode (drain line) branched from the scan line. In addition, the driving TFT serves to drive the organic light emitting element by supplying the current to the organic light emitting diode (OLED) of the pixel selected by the switching TFT. The driving TFT includes the gate electrode connected with the drain electrode of the switching TFT, the semiconductor layer, the source electrode connected to a driving current line, and the drain electrode. The drain electrode of the driving TFT is connected with the anode electrode of the organic light emitting diode (OLED).

As described above, the source electrode, the drain electrode, and the semiconductor layer constituting a plurality of TFTs having various purposes, and numerous electrodes lines connected therewith are disposed and a planarization layer may exist on an electrode layer.

The planarization layer may be constituted by one layer or a plurality of layers, and a pixel structure becomes complicated and a multi-layer planarization layer may be used for efficiently disposing a complicated electrode in order to implement a high-resolution and high-performance organic light emitting display device.

The anode electrode which is the pixel electrode may be disposed on the planarization layer, and the organic emission layer and the common electrode are disposed. While the organic light emitting diode constituted by the pixel electrode, the organic emission layer, and the common electrode is disposed on the common electrode, particles or debris may be undesirably generated, and as a result, an organic protective layer made of the organic material may be disposed in order to suppress damage to the organic light emitting diode from such debris.

As described above, the organic light emitting display device does not require a separate light source, and as a result, it is advantageous in implementing a flexible display device (which can be bent, folded, stretched or otherwise deformable) and to this end, as a substrate in which the organic light emitting display device and the driving element are disposed, a substrate made of a flexible polyimide based material may be used.

Since an organic light emitting substrate of the flexible display device is very thin in itself, the organic light emitting substrate may be rolled or bent, while a backplate is attached onto the bottom of the organic light emitting substrate to constitute the display device due to a problem in that force cannot be received during a manufacturing process and in terms of use as the display device.

In this case, as the backplate, a film of the same material such as at least one layer of polyethylene terephthalate (PET) may be used and the backplate may be a backplate having various shapes with or without curved surfaces.

In recent years, research for grafting various functions for protection from a hazardous environment to the organic light emitting display device to the backplate has been performed.

SUMMARY

The organic light emitting display device is a display device using organic light emitting diodes. Therefore, since the organic light emitting display device is vulnerable to oxygen and moisture, various technologies that seal or encapsulate organic light emitting diodes are used.

Further, in recent years, technologies that minimize moisture penetration in the display device itself have been used in addition to a technology that seals the organic light emitting diode with respect to appearance of display devices used in an environment having a lot of moisture, such as a smart watch or other user wearable device.

With the recent multi-purpose uses of the display device, the importance of a technology that minimizes the moisture penetration further increases in addition to the sealing technology in the display device using the flexible substrate.

Moreover, since the flexible substrate such as polyimide has a higher moisture permeation rate than that of the organic substrate in the related art, it is necessary to provide against a permeation path through the bottom of the substrate with respect to a permeation path of the moisture in order to implement the organic light emitting display device with the flexible display device.

Further, a moisture-proof function to minimize deterioration of the organic light emitting diode due to the permeation of the moisture such as sweat becomes an important technological issue with wearable devices.

Therefore, an organic light emitting display device including a special structure is disclosed. The organic light emitting display device includes a multi-function backplate that is capable of minimizing permeation of moisture from the bottom of a substrate with respect to the organic light emitting display device including the backplate.

In addition, the flexible substrate such as polyimide needs to minimize the generation of static electricity in addition to blocking moisture. Since the polyimide based substrate has a higher static electricity generation rate than the existing glass substrates, the static electricity affects the driving elements and the lines disposed in the display device and furthermore, a risk of short-circuits is also increased. Therefore, the static electricity needs to be minimized.

Accordingly, an organic light emitting display device including a special structure is disclosed. The organic light emitting display device includes a multi-function backplate that is capable of minimizing the influenced by the static electricity while minimizing the permeation of the moisture with respect to the organic light emitting display device including the backplate.

The aspects of the present disclosure are not limited to the aforementioned, and other aspects, which are not mentioned above, will be apparent to a person having ordinary skill in the art from the following description.

According to an aspect of the present disclosure, there is provided an organic light emitting display device capable of minimizing permeation of moisture. The organic light emitting display device includes a substrate comprising an organic light emitting diode, the substrate having a thickness of 5 $\mu$m to 50 $\mu$m; and a protective substrate supporting the substrate, wherein the protective substrate includes a blocking layer configured to protect the substrate from moisture permeating through a bottom surface of the substrate.

According to another aspect of the present disclosure, there is provided an organic light emitting display device comprising: a plastic substrate comprising at least one driving element; an organic light emitting diode on the plastic substrate and the organic light emitting diode connected with the driving element; and a protective substrate contacting a bottom surface of the plastic substrate and supporting the plastic substrate, wherein the protective substrate includes a blocking layer made of a conductive material, the blocking layer protecting the plastic substrate from moisture permeating through the bottom surface of the plastic substrate.

According to yet another aspect of the present disclosure, there is provided an organic light emitting display device comprising: a substrate comprising at least one driving element; an organic light emitting diode disposed on the substrate and connected to the driving element; a protective substrate contacting a bottom surface of the substrate, the protective substrate supporting the substrate, and an adhesive layer between the substrate and the protective substrate, the adhesive layer adhering together the substrate and the protective substrate, and the adhesive layer comprising particles made of moisture adsorbing material.

The effects of the present disclosure are not limited to the aforementioned effects, and other effects, which are not mentioned above, will be apparent to a person having ordinary skill in the art from the following description.

The objects to be achieved by the present disclosure, the aspects, and the effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided to complete the present disclosure and to allow a person having ordinary skill in the art to practice the various features in an enabling manner.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of certain technologies may have been omitted to avoid unnecessarily obscuring the inventive concepts of the present disclosure. The terms such as "including," "having," and "consist of" used herein are generally intended to allow other components to be added unless the terms are used with the term "only". Any references to singular may include plural unless expressly stated otherwise.

Components should be interpreted to include an ordinary error range or technical margins of error even if not expressly stated.

When the positional relationship between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals may denote the same elements.

Since size and thickness of certain components or elements illustrated in the drawings are represented for convenience in explanation, the present disclosure is not necessarily limited to the illustrated size and thickness of each component or element.

The features of various embodiments of the present disclosure can be partially or entirely bonded to or combined with each other and can be interlocked and operated in technically various ways, and the embodiments can be carried out, entirely or in parts, independently of or in association with each other.

Hereinafter, various exemplary embodiments of the present disclosure will be described in detail with reference to the accompanying drawings.

Figure 1:
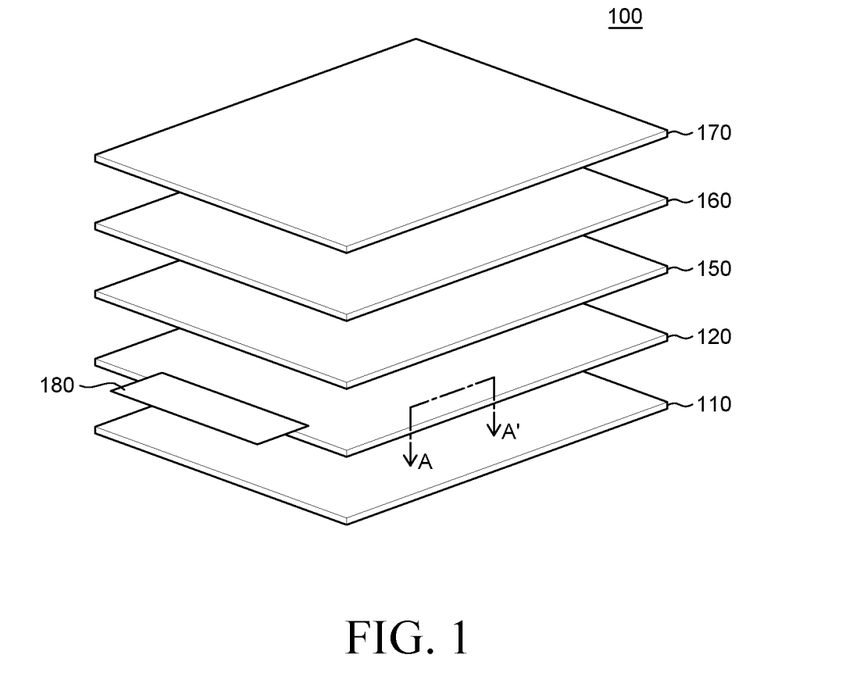
FIG. 1 is a schematic perspective view for describing an organic light emitting display device having a protective substrate according to an exemplary embodiment of the present disclosure.

FIG. 1 is a schematic perspective view for describing an organic light emitting display device having a protective substrate according to an exemplary embodiment of the present disclosure.

Referring to FIG. 1, the organic light emitting display device 100 may include a protective substrate 110, an organic light emitting substrate 120, a barrier substrate 150, an optical substrate 160, a cover glass 170, and an FPCB (flexible printed circuit board) 180.

For ease of description, detailed components such as a driving element 130 and an organic light emitting diode 140 disposed on the organic light emitting substrate 120 are omitted. Various components such as the driving element 130, line electrodes, and the organic light emitting diode 140 constituting the organic light emitting display device 100 are disposed in the organic light emitting substrate 120. A basic organic light emitting diode substrate 120 may be made of an insulation material such as a plastic material having flexibility. In this case, a substrate 121 may be implemented by a thin film plastic film made of polymers including at least one among polyimide, polyethylene naphthalate (PEN), polyethylene terephthalate (PET), and the like. The substrate 121 may have a thickness of, for example, 5 to 50 μm in order to maintain excellent flexibility. Such substrate 121 may be bent, foldable, stretchable or otherwise deformable.

An active area and a bezel area are defined in the organic light emitting substrate 120 and the organic light emitting substrate 120 is illustrated while the active area and the bezel area are omitted, but a plurality of organic light emitting diodes is disposed in the active area constitute a plurality of pixels.

Further, the organic light emitting substrate 120 includes thin film transistors which are a plurality of driving elements in order to supply a signal and current for driving the plurality of pixels. A switching thin film transistor and a driving thin film transistor connected with the switching thin film transistor are disposed and the organic light emitting diode connected with the driving thin film transistor is disposed.

The thin film transistors (the switching thin film transistor and the driving thin film transistor) are disposed to be connected with a gate line and a data line disposed on the organic light emitting substrate 120. The switching thin film transistor serves to select the pixel and is disposed at or near a portion where the gate line and the data line cross each other. The switching thin film transistor includes the gate electrode, the semiconductor layer, the source electrode, and the drain electrode.

The driving thin film transistor serves to drive an anode electrode of the pixel selected by the switching thin film transistor. The driving thin film transistor includes the gate electrode and the semiconductor layer connected with the drain electrode of the switching thin film transistor, the source electrode connected to a driving current line, and the drain electrode. The drain electrode as the driving thin film transistor is connected with the anode electrode which is the pixel electrode of the organic light emitting diode.

Various thin film transistors will be hereinafter referred to as the driving element.

The driving element controls current supply to the organic light emitting diode as described above and receives a control signal and current through the FPCB 180 connected with the organic light emitting substrate 120.

The FPCB 180 can be connected to a system board to supply an image signal and current to the organic light emitting substrate 120 and the FPCB 180 having a drive chip embedded therein may be used.

The organic light emitting diode is vulnerable to oxygen and moisture and as a result, the organic light emitting diode needs to be effectively covered by a multi-layer protective layer or films.

The barrier substrate 150 is attached with the organic light emitting substrate 120 so as to cover the organic light emitting diode and the barrier substrate 150 and the organic light emitting substrate 120 may adhere to each other by an adhesive layer.

The barrier substrate 150 may be a colorless transparent glass substrate or transparent substrate so as to minimize deterioration of visibility of the organic light emitting display device 100. For example, the barrier substrate 150 may be made of a transparent plastic material having flexibility.

In the exemplary embodiment illustrated in FIG. 1, the optical substrate 160 for suppressing reflections of external light may be further disposed on the barrier substrate 150. In this case, the visibility of the organic light emitting display device 100 may be further improved. The optical substrate 160 may adopt a film having polarization in order to suppress the deterioration of the visibility of the organic light emitting display device 100 due to reflection of external light by the pixel electrode disposed in the organic light emitting diode at the organic light emitting substrate 120.

The cover glass 170 may be disposed on the optical substrate 160. As the cover glass 170, a material such as glass, may be used and tempered glass may be used in order to suppress damage to the organic light emitting display device 100 due to external impacts and may be an opaque printed cover glass 170 at areas other than an area for displaying an image.

Meanwhile, the protective substrate 110 may be disposed on the bottom of the organic light emitting substrate 120 and the protective substrate 110 supports the organic light emitting substrate 120 so as to suppress the organic light emitting substrate 120 from being too easily bent or torn. As mentioned above, in the organic light emitting substrate 120, the thin film made of the plastic material having the flexibility may be used as a basic base substrate and in this case, since the thickness of the organic light emitting substrate 120 is very small, the organic light emitting substrate 120 may be too easily bent or torn. The protective substrate 110 supports a thin film type organic light emitting substrate 120 to complement rigidity of the organic light emitting substrate 120.

Further, the protective substrate 110 may be configured to minimize moisture permeation via the bottom of the organic light emitting substrate 120 and to this end, an adhesion plane or surface(s) between the protective substrate 110 and the organic light emitting substrate 120 or the film configuring the protective substrate 110 may be subjected to water-repellent treatment. Further, in the protective substrate 110, undesirable static electricity may be generated when the organic light emitting substrate 120 is the substrate made of the plastic material. Since static electricity may influence the driving element or the organic light emitting diode disposed in the organic light emitting substrate 120, a component for discharging or blocking the static electricity may be added.

Such a component of the protective substrate 110 will be hereinafter described in more detail.

Figure 2:
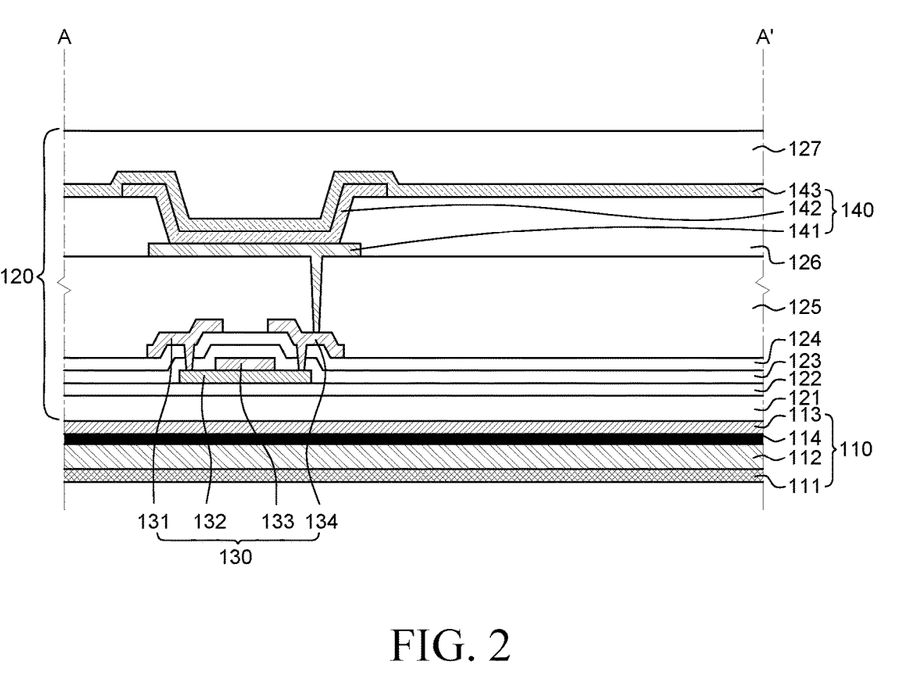
FIG. 2 is a schematic cross-sectional view for describing an organic light emitting display device having a protective substrate taken along line A-A' of FIG. 1 according to an exemplary embodiment of the present disclosure.

FIG. 2 is a schematic cross-sectional view for describing an organic light emitting display device having a protective substrate taken along line A-A' of FIG. 1 according to an exemplary embodiment of the present disclosure.

Referring to FIG. 2, the organic light emitting substrate 120 includes the driving element 130 and the organic light emitting diode 140.

The driving element 130 is disposed on a buffer layer 122 disposed in the substrate 121. The buffer layer 122 minimizes permeation of the moisture or impurities through the substrate 121 and planarizes (or flattens) the top of the substrate 121. However, the buffer layer 122 is not a particularly required component. Whether the buffer layer 122 is formed may be determined based on the type of the substrate 121 or the type of the driving element 130.

The driving element 130 may be formed on the buffer layer 122 and supplies signals and current to the organic light emitting diode 130. The driving element 130 includes an active layer 132, a gate electrode 133, a source electrode 131, and a drain electrode 134. In detail, the active layer 132 is formed on the buffer layer 122 and a gate insulating layer 123 for insulating the active layer 132 and the gate electrode 133 is formed on the active layer 132. Further, the gate electrode 133 is formed on the gate insulating layer 123 to overlap with the active layer 132 and an interlayer insulating layer 124 is formed on the gate electrode 133 and the gate insulating layer 123. The source electrode 131 and the drain electrode 134 are formed on the interlayer insulating layer 124. The source electrode 131 and the drain electrode 134 are electrically connected with the active layer 132.

In addition, the active layer 132 may be formed of amorphous silicon (a-Si), polycrystalline silicon (poly-Si), an oxide semiconductor, an organic semiconductor, or the like. When the active layer 132 is formed of oxide semiconductor, the active layer 132 may be made of ITO, IZO, indium gallium zinc oxide (IGZO), indium tin zinc oxide (ITZO), or the like, but is not limited thereto. When the active layer 132 is made of the IGZO, a ratio of In:Ga:Zn may be 1:2:1. In this case, in the active layer 132, a Ga-rich layer that reduces PBTS may be formed on the top of an IGZO layer. It should be noted that all transistors (i.e. drive elements, switch elements, etc.) on the substrate 121 may have active layers of the same material, or some transistors may have different active layer materials compared to other transistors. Namely, some transistors may have amorphous silicon (a-Si) active layers while other transistors may have oxide semiconductor active layers on the same substrate 121.

In FIG. 2, only the driving element 130 connected with the anode 141 of the organic light emitting diode 140 among various thin film transistors which may be included in the organic light emitting display device 100 is illustrated for ease of description. However, the organic light emitting display device 100 may further include the switching thin film transistor or a capacitor for driving the organic light emitting diode 140. Further, in the present specification, it is described that the driving element 130 has a coplanar structure, but a thin film transistor having an inverted staggered structure may also be used. In addition, in FIG. 2, a structure in which the anode 141 of the organic light emitting diode 140 is connected with the drain electrode 134 of the driving element 130 is illustrated, but the anode 141 of the organic light emitting diode 140 may be connected with the source electrode 131 of the driving element 130 according to a design.

A planarization layer 125 may be disposed on the driving element 130. The planarization layer 125 as a layer that planarizes the top of the substrate 121 may be made of an organic insulating material to cover an upper step (or other surface irregularities) of the substrate 121. The planarization layer 125 includes one or more contact holes for electrical connection with the anode 141 of the organic light emitting diode 140.

The organic light emitting diode 140 may be disposed on the planarization layer 125 and includes the anode 141, an organic layer 142, and a cathode 143. Although only one organic light emitting diode 140 is illustrated in FIG. 2, a plurality of organic light emitting diodes 140 may be disposed to correspond to a plurality of pixel areas of the organic light emitting display device 100.

The anode 141 is an electrode that supplies holes to the organic layer 142 and may be made of a transparent conductive material having a high work function. The transparent conductive material may include ITO, IZO, ITZO, and the like, but is not limited thereto. When the organic light emitting display device 100 is driven by a top emission scheme as illustrated in FIG. 2, the anode 141 may further include a reflective plate. Herein, the anode 141 may be referred to as the pixel electrode.

The cathode 143 as an electrode that supplies electrons to the organic layer 142 may be made of metal having a relatively low work function, for example, silver, titanium (Ti), aluminum, molybdenum (Mo), or an alloy (Ag:Mg) of silver and magnesium. Herein, the cathode 133 may be referred to as the common electrode. When the cathode 133 is made of the alloy of silver and magnesium, resistance of the cathode 143 may be reduced by making the content of silver be higher than the content of magnesium. In this case, an ytterbium (YB) layer may be disposed in an upper part, a lower part, or each of the upper and lower parts in order to suppress a decrease in resistance due to oxidization of silver.

The organic layer 142 is disposed between the anode 141 and the cathode 143. The organic layer 142 includes an organic emission layer. The organic emission layer has a patterned emission layer structure as illustrated in FIG. 2. In this case, emission layers emitting different colors may be separated for each sub-pixel in a pixel. For example, a red organic emission layer for emitting red light, a green organic emission layer for emitting green light, and a blue organic emission layer for blue light may be part of a red sub-pixel, a green sub-pixel, and a blue sub-pixel, respectively. In this case, the red sub-pixel, the green sub-pixel, and the blue sub-pixel may constitute one pixel. In each of the red organic emission layer, the green organic emission layer, and the blue organic emission layer, the holes and the electrons supplied through the anode 141 and the cathode 143 are coupled to each other to emit light. The respective organic emission layers may be pattern-deposited by using a mask having openings for each sub-pixel, for example, a so-called fine metal mask (FMM). However, the organic emission layers are not limited thereto and the organic light emission layers may be commonly formed across all sub-pixels on the substrate 121. In this case, the organic emission layers may be made of a material emitting white light and a color filter layer (or color refiner structure) may be disposed for each sub-pixel or pixel to correspond to an area where the organic emission layer emits the light.

The organic layer 142 may further include organic layers such as an injecting layer and a transporting layer for enhancing emission efficiency of the organic light emitting diode in addition to the organic emission layer. At least some of the organic layers may have a common structure in which some organic layers are commonly disposed in a plurality of sub-pixels in order to acquire an advantages in the manufacturing process.

Herein, the organic layers having the common structure may be formed by use of a common mask in which all sub-pixels areas have openings and the organic layers may be stacked in all sub-pixels without a pattern for each sub-pixel in the same structure. That is, the organic layers having the common structure are commonly connected or extended from one sub-pixel to a neighboring sub-pixel without any disconnected portions and thus shared by the plurality of sub-pixels.

For example, a hole injection layer or a hole transport layer for smoothly moving the holes may be further disposed between the anode 141 and the cathode 143 in addition to the organic emission layer. The hole injection layer or the hole transport layer may have the common structure in which the hole injection layer or the hole transport layer is commonly disposed in the plurality of sub-pixels. In some exemplary embodiments, the hole transport layer may be configured by a p type hole transport layer doped with a p type dopant.

In addition, the bank layer 126 may define an area of each sub-pixel and exposes a part of the top of the anode 141. In detail, the bank layer 126 may be disposed to cover an edge of the anode 141. The bank layer 126 can be made of an insulation material in order to insulate the anodes 141 of adjacent sub-pixels from each other. According to some exemplary embodiments, the bank layer 126 may be configured by a so-called black bank structure containing black dye material or the like having high optical absorption rate in order to suppress color mixing among the adjacent subpixels.

Meanwhile, a filling member 127 for filling a separation space from an upper barrier substrate, and the like may be disposed on the organic light emitting diode 140. The filling member 127 may be formed by a transparent moisture proof agent so as to suppress moisture from permeating the organic light emitting diode 140.

The protective substrate 110 may be disposed on the bottom of the substrate 121. The protective substrate 110 supports the substrate 121 so as to suppress the substrate 121 from being too easily bent or torn. As mentioned above, the substrate 121 may be a thin film type made of plastic having flexibility and in this case, since the thickness of the substrate 121 is very small, the substrate 120 may be too easily bent or torn. The protective substrate 110 supports the thin film type substrate 121 to complement the rigidity of the substrate 121.

The protective substrate 110 may include a protective film 111, a base film 112, an adhesive 113, and a complex blocking layer 114. The protective substrate 110 is schematically illustrated in FIG. 2, but the protective substrate 110 may be a multi-layer structure in which at least one base film is repeatedly stacked.

The protective film 111 may be a film made of PET and a transparent film that allows for visual examination or inspection. In more detail, the visual examination of the bottom of the substrate where the organic light emitting diode is disposed may be performed through the bottom of the protective film 111 and to this end, the protective film 111 may be a transparent film having a light transmittance of 30% or more.

The base film (alternatively, base layer 112) may be configured as a plastic thin film made of polyimide, polyethylene naphthalate (PEN), polyethylene terephthalate (PET), other appropriate polymers, a combination of the polymers, and the like.

The adhesive layer 113 may be disposed by using an acrylic-based adhesive and an acid-free material may be used for suppressing a yellow color phenomenon of the adhered surface. When an adhesive having an acid-free property is used to allow for visual examination, transparency increases as compared with the adhesive having acid-free property is not used to more effectively allow visual examinations to be performed. Adhesive force of the adhesive layer 113 may be 400 to 500 gt/25 mm to efficiently maintain an adhesive relationship between the protective substrate 110 and the organic emission substrate 120.

The complex blocking layer 114 may be disposed between the adhesive layer 113 and the base film 112 as shown in FIG. 2. However, the complex blocking layer 114 may be disposed between different layers constituting the protective substrate 110.

The complex blocking layer 114 may be made of a conductive material, for example, transparent conductive oxide such as, for example, ITO, IZO, ITZO, or the like or metal including aluminum, titanium, magnesium, and the like. However, the complex blocking layer 114 need not be made of a transparent material. When the complex blocking layer 114 is made of the transparent conductive oxide, the complex blocking layer 114 may efficiently suppress the permeation of the moisture, and as a result, the complex blocking layer 114 may serve as a moisture permeation suppressing layer that suppresses the moisture from permeating into the bottom of the substrate 121. That is, the complex blocking layer 114 protects the substrate from moisture permeating through the bottom surface of the substrate 121. The complex blocking layer 114 may protect the substrate by blocking moisture from permeating through the bottom surface of the substrate 121. The blocking layer 114 may block moisture by partially blocking moisture from permeating through the bottom surface of the substrate 121 or blocking all moisture from permeating through the bottom surface of the substrate 121.

Further, the complex blocking layer 114 may minimize the damage to the organic light emitting display device 100 caused by light. In detail, while the organic light emitting display device 100 is manufactured, a part of the substrate 121 may be exposed to external light. Undesirable state changes (for example, voltage shifts in the driving element-TFTs) may occur in the components on the substrate 121 and in some materials used for manufacturing the components themselves due to the light exposure which occurs while the organic light emitting display device 100 is manufactured. In particular, some parts of the substrate 121 may be more strongly exposed to the external light than other parts, and as a result, display non-uniformity (for example, stains, shadow defects, and the like) may be caused. However, if the complex blocking layer 114 disposed in the protective substrate 110 further includes a light blocking material, the external light is efficiently absorbed by the light blocking material, and as a result, the problems which occur during a light exposure process may be minimized.

Further, the complex blocking layer 114 may be made of the conductive material or metal to suppress static electricity which may affect the substrate 121 made of plastic or the complex blocking layer 114 is grounded to discharge the static electricity, thereby minimizing the damage due to static electricity.

FIGS. 3A to 3D are schematic plan views for describing various components of the protective substrate having a complex blocking layer.

Figure 3A:
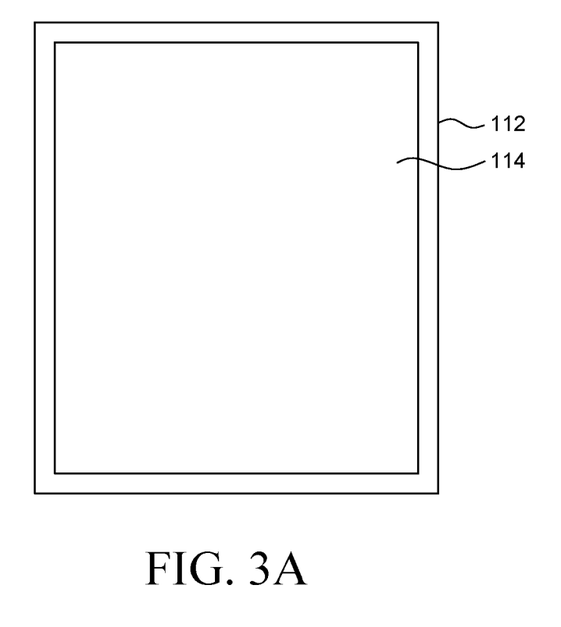
FIGS. 3A to 3D are schematic plan views for describing various components of the protective substrate having a complex blocking layer.
Figure 3B:
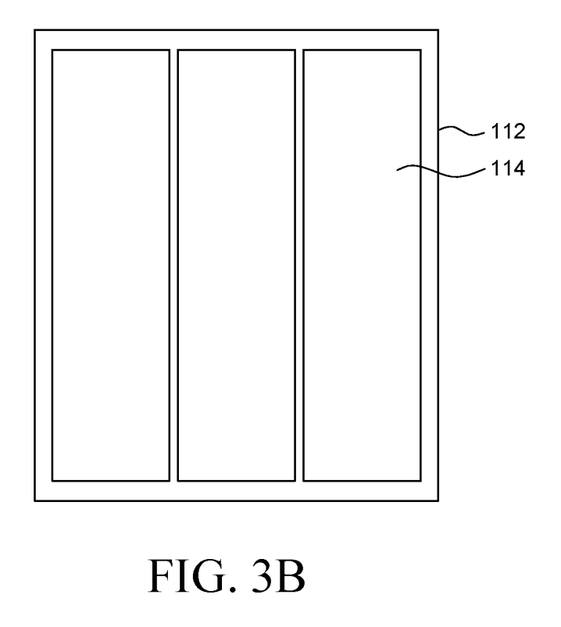
Figure 3C:
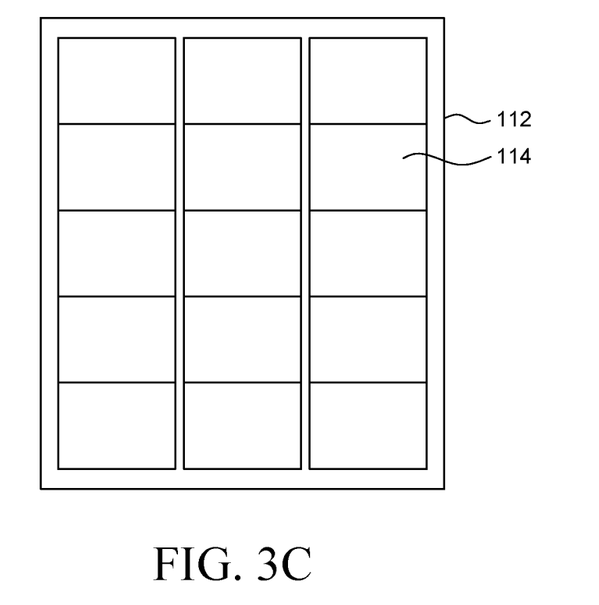

With reference to FIGS. 3A to 3D, the complex blocking layer 114 may be disposed on a whole surface of the base film 112 as illustrated in FIG. 3A, disposed unidirectionally as illustrated in FIG. 3B, or divisionally disposed in a stripe pattern, a streamlined pattern, or a plurality of block patterns as illustrated in FIG. 3C. Meanwhile, the complex blocking layer 114 could have a combination of at least two patterns among the mesh pattern, the stripe pattern and the streamlined pattern.

Figure 3D:
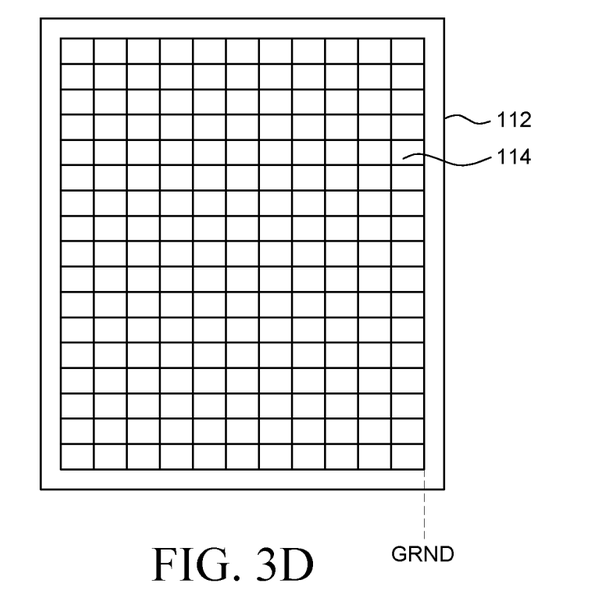

However, when only induction and discharge of static electricity are considered with respect to the complex blocking layer 114, a conductive metal electrode is disposed in the base film 112 and grounded (GRND) to discharge the static electricity as illustrated in FIG. 3D.

When an electrode, which may be made of copper, is disposed, the electrode may be disposed to cover the entire part or a portion as illustrated in FIGS. 3A to 3C and the electrode may be disposed to have a mesh pattern as illustrated in FIG. 3D.

Figure 4:
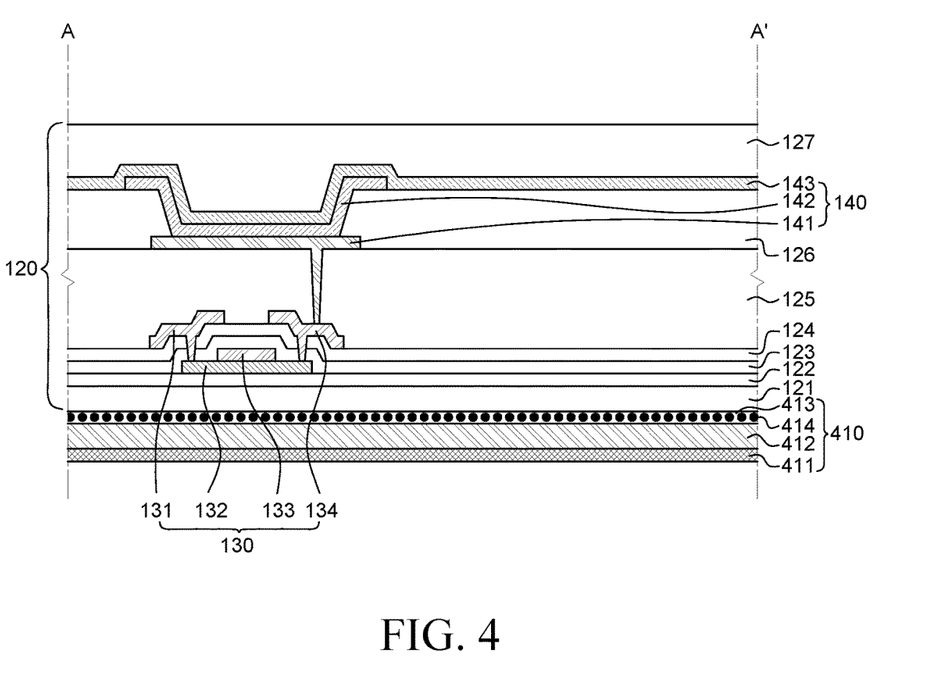
FIG. 4 is a schematic cross-sectional view for describing an organic light emitting display device having a protective substrate taken along line A-A' of FIG. 1 according to another exemplary embodiment of the present disclosure.

FIG. 4 is a schematic cross-sectional view for describing an organic light emitting display device having a protective substrate taken along line A-A' of FIG. 1 according to another exemplary embodiment of the present disclosure. The organic light emitting display device illustrated in FIG. 4 may be the same as the organic light emitting display device in FIG. 1 except that the configuration of a protective substrate 410 is different, and thus a duplicated description thereof will be omitted.

Referring to FIG. 4, the protective substrate 410 includes a protective film 411, a base film 412, and an adhesive layer 413 and the adhesive layer 413 includes particles 414.

The particles 414 are mixed in the adhesive layer 413. The particles 414 may be made of a material selected from a fluorine-based compound or an inorganic material so as to minimize the permeation of the moisture. The adhesive layer 413 is configured to include the particles 414 to maintain the adhesive force between the protective substrate 410 and the organic emission substrate 120 while minimizing the permeation of the moisture. That is, in the organic light emitting display device illustrated in FIG. 4, the adhesive layer 413 including the particles may perform a function of the complex blocking layer.

In FIG. 4, it is illustrated that the particles 414 are mixed and disposed on the adhesive layer 413 as described above, but the particles 414 may be mixed and disposed on another layer constituting the protective substrate 410.

The particles 414, from a bonding chemical of C and F, may be mixed in the adhesive layer 413. Also, fluorine compound having low surface tension may also be used as the particles 414. Alternatively, the particles made of the inorganic material may be mixed in the adhesive layer 413 to control the permeation of the moisture to be minimized.

The particles 414 mixed in the adhesive layer 413 may be made of a material having water repellency or the particles 414 made of a moisture absorption agent capable of absorbing the moisture can be mixed in the adhesive layer 413 to adsorb the permeated moisture, thereby minimizing the permeation of the moisture in the bottom of the substrate 121.

Figure 5:
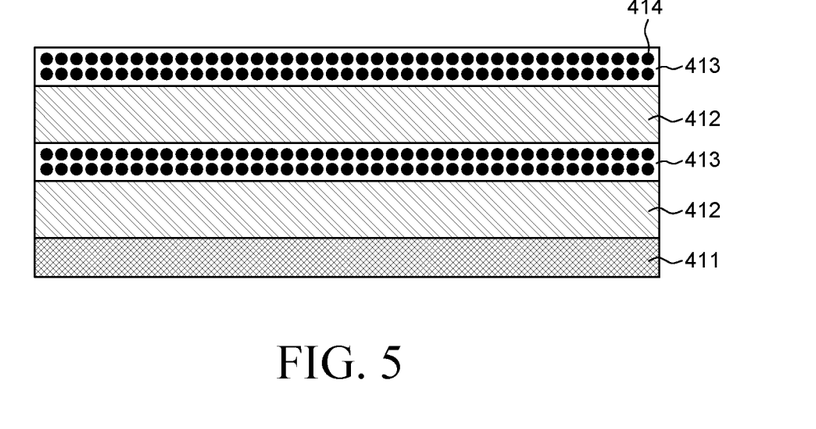
FIG. 5 is a schematic cross-sectional view for describing various components of the protective substrate having an adhesive layer according to another exemplary embodiment of the present disclosure.

FIG. 5 is a schematic cross-sectional view for describing various components of the protective substrate according to another exemplary embodiment of the present disclosure.

Referring to FIG. 5, a structure is provided, in which the base film 412 is disposed on the protective film 411, the adhesive layer 413 and another base film 412 are disposed, and such steps can be repeated.

The adhesive layer 414 may include the particles 414 and the adhesive layer 413 including the particles 414 may minimize the permeation of the moisture.

Each of at least two or more layers of adhesive layers 413 may include the particles 414 having a water repellent function or the particles 414 made of the material adsorbing the moisture or the particles 414 having the water repellent function and the particles 414 adsorbing the moisture are mixed with each other to be included in the adhesive layer 413.

In the case where two or more layers of base films 412 are used, the damage from external impacts may be further minimized as compared with the case where one layer is used.

Figure 6:
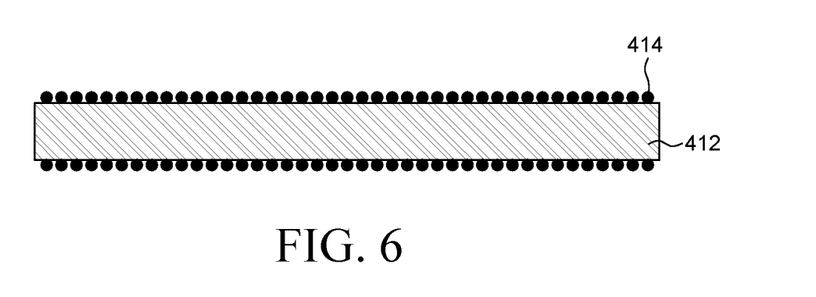
FIG. 6 is a schematic cross-sectional view for describing a protective substrate including a base substrate having a moisture permeation suppressing function according to another exemplary embodiment of the present disclosure.

FIG. 6 is a schematic cross-sectional view for describing a protective substrate including a base film having a moisture permeation suppressing function according to another exemplary embodiment of the present disclosure.

Referring to FIG. 6, one surface of the base film 412 may be subjected to CF2 plasma processing in order to minimize the permeation of the moisture. For example, the bottom surface or the top surface of the base film 412 may be subjected to CF2 plasma processing to minimize the permeation of moisture into a bottom surface of the substrate 121.

The particles 414 may be mixed in the adhesive layer 413 in order to minimize the permeation of the moisture, but instead of adding such particles 414, if the substrate is treated with CF2 plasma by considering the adhesive force of the adhesive layer 413, the permeation of the moisture may be minimized similarly to the case where the particles 414 are mixed into the adhesive layer 413.

The exemplary embodiments of the present disclosure can also be described as follows:

According to an aspect of the present disclosure, an organic light emitting display device comprises a substrate having an organic light emitting diode and a protective substrate supporting the substrate. The protective substrate includes a complex blocking layer configured to minimize permeation of moisture.

The complex blocking layer may be made of a transparent a conductive material or a metallic material so as to minimize static electricity and moisture which may permeate through a bottom of the substrate.

The complex blocking layer may have at least one among a mesh pattern, a stripe pattern, and a streamlined pattern and could have combination thereof.

The protective substrate may further include abase film and an adhesive layer, and the complex blocking layer may be disposed between the base film and the adhesive layer.

The the complex blocking layer may be an acrylic-based adhesive layer including particles mixed therein order to minimize the permeation of the moisture, and the particles may be made of at least one material selected from a fluorine-based compound or an inorganic material or or a Si based water repellent material.

The protective substrate may be a multi-layer structure including a base film made of plastic, and the acrylic-based adhesive layer may be disposed on the base film and contacts the substrate, and the base film may have a light transmittance of 30% or more.

The protective substrate may further include a base film and an adhesive layer made of the plastic, and the adhesive layer may be disposed on the base film and contacts the substrate, and one surface of the base film may be treated with CF2 plasma.

According to another aspect of the present disclosure, an organic light emitting display device comprises a plastic substrate having at least one driving element, an organic light emitting diode disposed on the plastic substrate and connected with the driving element and a protective substrate contacting a bottom of the plastic substrate and supporting the plastic substrate. The protective substrate includes a complex blocking layer made of a conductive material.

The the protective substrate may include a PET layer, and the complex blocking layer may be disposed between the PET layer (having a light transmittance of 30% or more) and the substrate.

The protective substrate may further include a ground electrode electrically connected with the complex blocking layer.

The protective substrate may include a polyethylene terephthalate (PET) film covered with a whole-surface or bottom protective layer, and the complex blocking layer may be disposed between the whole-surface or bottom protective layer and the PET film, may be configured by an indium tin oxide (ITO) film, a metal mesh layer, or a combination thereof, and may be implemented to remove static electricity and suppress permeation of moisture into the bottom and the sides thereof.

In the complex blocking layer, the necessity of at least one of a conventional back support member BSM and a conventional barrier film is excluded.

The complex blocking layer may be implemented to protect the organic light emitting diodes from heat generated from a battery positioned adjacent to the protective substrate.

According to yet another aspect of the present disclosure, an organic light emitting display device comprises a substrate having at least one driving element, an organic light emitting diode disposed on the substrate and connected with the driving element and a protective substrate contacting the bottom of the substrate so as to support the substrate. The protective substrate and the substrate adhere to each other by an adhesive layer including particles made of a material that adsorbs moisture.

The protective substrate may include a PET based base layer having a light transmittance of 30% or more.

The organic light emitting display device may further comprise a protective film on the bottom of the base layer.

The particles may include a Si based water repellent material.

The particles may be a fluorine-based compound or an inorganic material serving to suppress permeation of moisture, and the type, the content, and the distribution of the fluorine-based compound or the inorganic material may be determined depending on the size and the purpose of the substrate and the protective substrate.

In the adhesive layer, the necessity of at least one of a conventional BSM and a conventional barrier film is excluded.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
a substrate having a thickness of 5 µm to 50 µm;
a buffer layer on the substrate;
a driving element on the buffer layer;
a planarization layer on the driving element;
an organic light emitting diode on the planarization layer; and
a protective substrate supporting the substrate, the protective substrate including a protective film, a base film on and in contact with the protective film, a blocking layer on and in contact with the base film, and an adhesive layer on and in contact with the blocking layer and configured to adhere the protective substrate to a bottom surface of the substrate,
wherein the blocking layer is configured to protect the substrate from moisture permeating through the bottom surface of the substrate, and
wherein the buffer layer is contacted with an upper surface of the substrate.

2. The organic light emitting display device according to claim 1, wherein the blocking layer is made of a transparent conductive material or a metallic material that protects the organic light emitting display device from static electricity and the permeation of moisture through the bottom surface of the substrate.

3. The organic light emitting display device according to claim 2, wherein the blocking layer comprises one of a mesh pattern, a stripe pattern, a streamlined pattern, or a combination of the mesh pattern, the stripe pattern, and the streamlined pattern.

4. The organic light emitting display device according to claim 2, wherein the blocking layer is disposed between the base film and the adhesive layer.

5. The organic light emitting display device according to claim 1, wherein the blocking layer is an acrylic-based adhesive layer including particles made of a material that protects the bottom surface of the substrate from the permeation of the moisture, and
wherein the material of the particles includes at least one selected from a group consisting of a fluorine-based compound, an inorganic material, and a silicon based water repellent material.

6. The organic light emitting display device according to claim 5, wherein the base film is made of plastic, and
wherein the acrylic-based adhesive layer is disposed on the base film and contacts the substrate, and
wherein the base film has at least a 30% light transmittance.

7. The organic light emitting display device according to claim 1, wherein the base film and the adhesive layer that are both made of plastic,
the adhesive layer is disposed on the base film and the adhesive layer contacts the bottom surface of the substrate, and
either a bottom surface or a top surface of the base film is treated with CF2 plasma.

8. An organic light emitting display device, the device comprising:
a plastic substrate comprising a substrate, a buffer layer on the substrate and at least one driving element on the buffer layer;
an organic light emitting diode on the plastic substrate and the organic light emitting diode connected with the driving element; and
a protective substrate contacting a bottom surface of the plastic substrate and supporting the plastic substrate, the protective substrate including a protective layer, a base layer on and in contact with the protective layer, a blocking layer on and in contact with the base layer, and an adhesive layer on and in contact with the blocking layer and configured to adhere the protective substrate to a bottom surface of the substrate;
wherein the blocking layer is made of a conductive material and the blocking layer protects the plastic substrate from moisture permeating through the bottom surface of the plastic substrate,
wherein the buffer layer is contacted with an upper surface of the substrate.

9. The organic light emitting display device according to claim 8, wherein the protective layer is a polyethylene terephthalate (PET) layer that has at least a 30% light transmittance, and
wherein the blocking layer is disposed between the PET layer and the plastic substrate.

10. The organic light emitting display device according to claim 8, wherein the protective substrate further includes a ground electrode electrically connected with the blocking layer.

11. The organic light emitting display device according to claim 8, wherein the base layer is a polyethylene terephthalate (PET) film, a bottom surface or a top surface of the PET film covered by the protective layer, and
wherein the blocking layer is disposed between the protective layer and the PET film,
wherein the blocking layer comprises an indium tin oxide (ITO) film, a metal mesh layer, or a combination of the ITO film and the metal mesh layer, and
wherein the blocking layer protects the organic light emitting display device from static electricity and the blocking layer protecting the plastic substrate from moisture permeating into the bottom surface of the plastic substrate.

12. The organic light emitting display device according to claim 8, wherein the blocking layer lacks at least one of a back support member (BSM) and a barrier film.

13. The organic light emitting display device according to claim 8, wherein the blocking layer protects the organic light emitting diode from heat generated from a battery positioned adjacent to the protective substrate.

14. An organic light emitting display device comprising:
a substrate comprising at least one driving element;
an organic light emitting diode disposed on the substrate and connected to the driving element; and
a protective substrate including a protective film, a plurality of adhesive layers and a plurality of base films, the protective substrate contacting a bottom surface of the substrate and supporting the substrate, and
wherein the plurality of adhesive layers are disposed between the substrate and the protective film of the protective substrate, the plurality of adhesive layers adhere together the substrate and the protective substrate, and each of the plurality of adhesive layers comprises particles made of moisture adsorbing material, wherein at least one of the plurality of adhesive layers is between and in contact with the plurality of base films.

15. The organic light emitting display device according to claim 14, wherein each of the plurality of base films have at least a 30% light transmittance.

16. The organic light emitting display device according to claim 15, wherein the protective film is on a bottom surface of a base film located at the bottom of the plurality of base films.

17. The organic light emitting display device according to claim 14, wherein the particles include a silicon (Si) based water repellent material.

18. The organic light emitting display device according to claim 14, wherein the particles include a fluorine-based compound or an inorganic material that protects the substrate from moisture permeating into the bottom surface of the substrate.

19. The organic light emitting display device according to claim 14, wherein the adhesive layer lacks at least one of a back support member (BSM) or a barrier film.

* * * * *